US009432041B2

(12) United States Patent
Giacomini et al.

(10) Patent No.: US 9,432,041 B2
(45) Date of Patent: Aug. 30, 2016

(54) METHOD OF CALIBRATING A THERMOMETER-CODE SAR A/D CONVERTER AND THERMOMETER-CODE SAR-A/D CONVERTER IMPLEMENTING SAID METHOD

(71) Applicant: STMICROELECTRONICS S.r.l., Agrate Brianza (MB) (IT)

(72) Inventors: Mauro Giacomini, Bergamo (IT); Carmelo Burgio, Bergamo (IT)

(73) Assignee: STMICROELECTRONICS S.R.L., Agrate Brianza (MB) (IT)

(*) Notice: Subject to any disclaimer, the term of this patent is extended or adjusted under 35 U.S.C. 154(b) by 0 days.

(21) Appl. No.: 14/683,325

(22) Filed: Apr. 10, 2015

(65) Prior Publication Data

US 2015/0303933 A1    Oct. 22, 2015

(30) Foreign Application Priority Data

Apr. 17, 2014  (IT) .............................. MI2014A0720

(51) Int. Cl.
*H03M 1/10* (2006.01)
*H03M 1/08* (2006.01)
(Continued)

(52) U.S. Cl.
CPC ......... *H03M 1/0809* (2013.01); *H03M 1/1033* (2013.01); *H03M 1/1057* (2013.01);
(Continued)

(58) Field of Classification Search
CPC ........... H03M 1/0809; H03M 1/1033; H03M 1/1245; H03M 1/804; H03M 1/466; H03M 1/464
USPC ................. 341/120, 144, 155, 118, 163, 153
See application file for complete search history.

(56) References Cited

U.S. PATENT DOCUMENTS 7,068,201 B1 *  6/2006  Chou ................... H03M 1/0602
                                                   341/144
7,777,662 B2 *  8/2010  Meynants ............... H03M 1/14
                                                   341/155

(Continued)

FOREIGN PATENT DOCUMENTS

EP      1 510 009       12/2003
EP      2 169 829        3/2010

OTHER PUBLICATIONS

Cong et al. "Switching Sequence Optimization for Gradient Error Compensation in Thermometer-Decoded DAC Arrays" IEEE Transactions on Circuits and Systems-II Analog and Digital Signal Processing, vol. 47, No. 7, July 2000. pp. 585-594.

(Continued)

*Primary Examiner* — Peguy Jean Pierre
(74) *Attorney, Agent, or Firm* — Allen, Dyer, Doppelt, Milbrath & Gilchrist, P.A.

(57) ABSTRACT

A method of calibrating a thermometer-code SAR-A/D converter is provided. The thermometer-code SAR-A/D converter includes an $N_{bit}$-bit digital-to-analog converter (DAC) for outputting an $N_{bit}$-bit output code. The DAC includes a first subconverter having a plurality of $N_{Th}$ thermometer elements $T_j$ and a second subconverter having a plurality of $N_{Bin}$ binary-weighted elements. The $N_{bit}$ output code is equal to the sum of $N_{BitTh}$ and $N_{BitBin}$ where $N_{Th}=2^{N_{BitTh}}$ and $N_{BitBin}$ is equal to $N_{Bin}=N_{BitBin}$. The calibration method includes determining an Integral Non-Linearity error value ($\epsilon_R$) of an $R^{th}$ thermometer-code level of the thermometer elements. The method further includes reducing the highest of the error value $\epsilon_R$ to obtain a reduced error value, and generating the output code according to said reduced error.

20 Claims, 5 Drawing Sheets

(51) Int. Cl.
*H03M 1/12* (2006.01)
*H03M 1/46* (2006.01)
*H03M 1/68* (2006.01)
*H03M 1/80* (2006.01)

(52) U.S. Cl.
CPC .......... *H03M1/1245* (2013.01); *H03M 1/464* (2013.01); *H03M 1/466* (2013.01); *H03M 1/687* (2013.01); *H03M 1/804* (2013.01); *H03M 1/806* (2013.01)

(56) References Cited

U.S. PATENT DOCUMENTS

| | | |
|---|---|---|
| 2003/0227402 A1 | 12/2003 | Starzyk et al. |
| 2006/0232461 A1* | 10/2006 | Felder .................. H03M 1/462 341/161 |
| 2010/0039194 A1* | 2/2010 | Darabi .................. H03B 5/364 334/55 |
| 2014/0266824 A1* | 9/2014 | Lowney ............. H03M 1/1009 341/120 |
| 2015/0042498 A1* | 2/2015 | Onody .................. H03M 1/66 341/144 |

OTHER PUBLICATIONS

Jiang et al. "A 12-8, 150 MHZ Sample/S COMOS Current Steering D/A Converter With Gradient Error Compensation" Analog Integrated Circuits and Signal Porcessing, 46. 263-273, 2006, Jan. 2005.

* cited by examiner $$E_j = \frac{T_j - T_{ref}}{T_{tot}} \Rightarrow T_j = T_{ref} + T_{tot} E_j$$

$$\sum_{all} T_j = T_{tot} = N_{th} T_{ref} + T_{tot} \sum_{all} E_j \Rightarrow T_{tot} = \frac{N_{th} T_{ref}}{1 - \sum_{all} E_j} \Rightarrow \frac{T_{ref}}{T_{tot}} = \frac{1 - \sum_{all} E_j}{N_{th}}$$

$$INL_R = \frac{\sum_{j=0}^{R-1} T_j}{T_{tot}} - \frac{R}{N_{th}} = \frac{\sum_{j=0}^{R-1}(T_{ref} + T_{tot} E_j)}{T_{tot}} - \frac{R}{N_{th}} = \frac{RT_{ref} + T_{tot}\sum_{j=0}^{R-1} E_j}{T_{tot}} - \frac{R}{N_{th}} = R\frac{T_{ref}}{T_{tot}} + \sum_{j=0}^{R-1} E_j - \frac{R}{N_{th}}$$

$$INL_R = R \frac{1 - \sum_{all} E_j}{N_{th}} + \sum_{j=0}^{R-1} E_j - \frac{R}{N_{th}} = \sum_{j=0}^{R-1} E_j - R \frac{\sum_{all} E_j}{N_{th}}$$

$$T_{ideal} = \frac{T_{tot}}{N_{th}} = \frac{T_{ref}}{1 - \sum_{all} E_j}$$

$$DNL_k = \frac{T_k - T_{ideal}}{N_{th} T_{ideal}} = \frac{T_{ref} + T_{tot} E_k - \frac{T_{ref}}{1 - \sum_{all} E_j}}{\frac{N_{th} T_{ref}}{1 - \sum_{all} E_j}} = \frac{1 + \frac{T_{tot}}{T_{ref}} E_k - \frac{1}{1 - \sum_{all} E_j}}{\frac{N_{th}}{1 - \sum_{all} E_j}} = \frac{1 + \frac{N_{th}}{1 - \sum_{all} E_j} E_k - \frac{1}{1 - \sum_{all} E_j}}{\frac{N_{th}}{1 - \sum_{all} E_j}} = E_k - \frac{\sum_{all} E_j}{N_{th}}$$

Fig. 4

METHOD OF CALIBRATING A THERMOMETER-CODE SAR A/D CONVERTER AND THERMOMETER-CODE SAR-A/D CONVERTER IMPLEMENTING SAID METHOD

FIELD OF THE INVENTION

The present disclosure relates to a method of calibrating a thermometer-code SAR-A/D converter, and a thermometer-code SAR A/D converter implementing the method. More particularly, the present disclosure relates to a method of calibrating the thermometer-code DAC converter that is part of the thermometer-code SAR-A/D converter to optimize the integral non-linearity of the analog-to-digital converter.

BACKGROUND OF THE INVENTION

SAR A/D converters are used for analog-to-digital conversion. In this type of converter, conversion is based on a dichotomic search through all possible quantization levels to determine the final conversion value.

Referring to FIG. 1, which shows a block diagram of a classical SAR-A/D converter, a digital-to-analog converter (DAC), a Successive Approximation Register (SAR), a Sample-and-Hold circuit (S/H), an input voltage Vin and a reference voltage Vref are illustrated. The Sample-and-Hold circuit, which may also be integrated in a voltage comparator Comp, is configured to capture the input voltage Vin. The voltage comparator Comp which compares the voltage Vin with the output of the DAC, is configured to transmit the result to the Successive Approximation Register SAR. The Successive Approximation Register SAR emits an approximate digital code of the Vin to the internal DAC. The output of the internal DAC is fed back to the comparator with an analog signal equivalent to the output digital code of the SAR to be compared with the input voltage Vin.

Binary-weighted physical elements are usually employed in the internal DAC to carry out the conversion process. For example, these binary-weighted physical elements include resistors, capacitors, current generators and the like.

To convert a voltage corresponding to the binary code '101001' (i.e., the code representing the number 41) using a binary converter having a number $N_{bit}=N_{BitBin}$ of bits equal to six, six physical elements are available. In the binary code '101001' the physical elements corresponding to the indices 0, 3 and 5 (i.e., the ones of the binary code '101001') are intended to be selected and the corresponding converted voltage is 41/64 Vref. Vref represents the reference voltage to be used for the conversion process.

However, if a thermometer-code SAR A/D converter is used, all the physical elements are nominally equal to one another. Therefore, during the conversion process, if the voltage corresponding to the binary code '101001' (41) has to be converted using a thermometer-code converter having a number $N_{bit}=N_{BitTh}$ of bits equal to six, all the physical elements, equal to 64 (because 2^6=64), corresponding to the indices from 0 to 40 are selected (whereas the physical elements corresponding to the indices from 41 to 63 are not selected). The corresponding converted voltage is always equal to 41/64 Vref.

Conversely, in a converter having a mixed thermometer-code and binary design, the plurality of physical elements that form the converter are divided into two subsets. One subset is formed by thermometer elements and the other subset is formed by binary-weighted elements. Namely, the binary-weighted elements define the LSB bits of the output code generated by the converter, whereas the thermometer elements define the MSB bits of such output code. The accuracy of the converter with the thermometer-code and binary design is set by the smallest physical element implemented in the binary elements and corresponds to 1 LSB, i.e., the bit corresponding to the zero index of LSB bits.

The example of FIG. 2 is a converter with a thermometer-code and binary design having twelve bits, with an output code organized as follows. The binary physical elements are used for indices from 0 to 5, which represent the LSB bits of the output code. This means that the 0 index is given by a binary element, the 1 index is given by a binary element having twice the value (of the binary element for the 0 index), the 2 index is given by a binary element having four times the value (of the binary element for the 0 index), and so on. The thermometer elements are used for indices from 6 to 11, which represent the MSB bits of the output code. Each index involves the addition of as many thermometer elements as required by the index weight.

The problem of such a thermometer-code ADC is that, as the latter generates the values of the various voltages $V_{Thermo}$ (Thermo=0, ... $2^N{}_{Th}$) of the thermometer levels as used in the A/D conversion process, these voltage values $V_{Thermo}$ are affected by the problem that the thermometer elements are not identical. They should ideally be identical but they actually exhibit non-idealities, which introduce an error in such voltage values $V_{Thermo}$.

Thus, assuming that 64 thermometer elements are provided, the ideal voltages $V_{Thermo}$ required during SAR conversion are:

$$V_{Thermo} = \frac{V_{ref}}{T_{tot}} \sum_{j=0}^{Thermo-1} T_j$$

The variable $T_{tot}$ is the total value of the thermometer elements Thermo and belongs to the set from 0 to 64 and $T_j$ belongs to the set $T_0, \ldots, T_{Thermo}-1$, because voltage levels are one more than the elements. Nevertheless, since all thermometer elements $T_j$ are imperfect, each having its own error $\tau_j$, then each thermometer element may be rewritten according to the formula $T_j=T_{ideal}+\tau_j$.

In view of the above, the real voltage values Vth required during SAR conversion are expressed by the following formula:

$$V_{Thermo} = \frac{V_{ref}}{T_{tot}} \sum_{j=0}^{Thermo-1} (T_{ideal} + \tau_j)$$

Thus, the INL error between the ideal and real voltage sequences may be expressed by the following formula:

$$INL_{Thermo} = \frac{V_{ref}}{T_{tot}} \sum_{j=0}^{Thermo-1} \tau_j$$

The variable $ILN_{Thermo}$ represents an error for the $n^{th}$ level of the DAC converter. The $ILN_{Thermo}$ depends on the order of thermometer-code errors and is inherently equal to zero for minimum and maximum voltage limits $V_{min}=0$ and $V_{max}=V_{ref}=V_{64}$ (because in this case the number of bits is supposed to be 6).

Various techniques have been suggested to minimize the $ILN_{Thermo}$ value, but they suffer from certain drawbacks, such as the following. The calibration process for the thermometer elements requires internal and/or external physical quantities, such as an accurately selected reference voltage. Any mismatch between reference physical quantities affects the accuracy of the output code. Expensive dedicated analog and/or digital hardware is required.

SUMMARY OF THE INVENTION

An object of the present invention is to provide a method, and a converter implementing the method, for calibrating a SAR A/D converter having a thermometer-code and binary design.

One embodiment provides a method of calibrating a thermometer-code SAR A/D converter that is more efficient, self-calibrating and does not require the introduction of dedicated hardware.

Particularly, due to the redundancy in the actuation order of the thermometer elements, error values may be minimized to a considerable extent as compared with the prior art.

BRIEF DESCRIPTION OF THE DRAWINGS

The characteristics and advantages of the present disclosure will appear from the following detailed description of a possible practical embodiment, illustrated as a non-limiting example in the set of drawings, in which:

FIG. 4 shows the mathematical calculations required to check the correctness of the calibration methods;

DETAILED DESCRIPTION OF THE PREFERRED EMBODIMENTS

Although this is not expressly shown, the individual features described with reference to each embodiment shall be intended as auxiliary and/or interchangeable with other features, as described with reference to other embodiments. Parts that have been described with reference to the prior art will be designated below, for simplicity, by the same numerals.

In view of minimizing or reducing the $INL_{Thermo}$ value without using dedicated or additional hardware, the redundancy in the actuation sequence of the thermometer elements $T_3$ is a key factor for efficient self-calibration of the thermometer-code SAR A/D converter.

All the actuation sequences are equivalent (because all the elements are to be identical, i.e., 64 LSB when $N_{BitBin}$ bit is equal to 6), but they are slightly different in practice. Any change in the actuation sequence of the elements involves a change in the output code of the ADC.

As mentioned above, the error between the ideal and real voltage sequences may be expressed by the following formula:

$$INL_{Thermo} = \frac{V_{ref}}{T_{tot}} \sum_{j=0}^{Thermo-1} \tau_j$$

Figure 1:
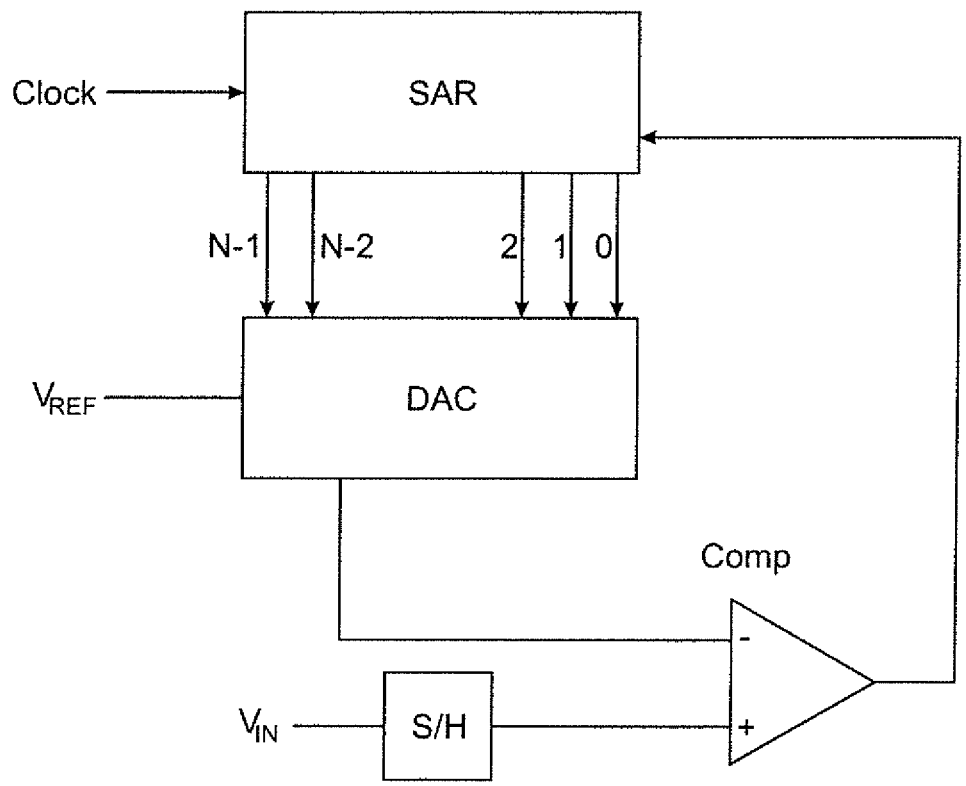
FIG. 1 shows a block diagram of a Successive Approximation SAR ADC converter of the prior art.
Figure 2:
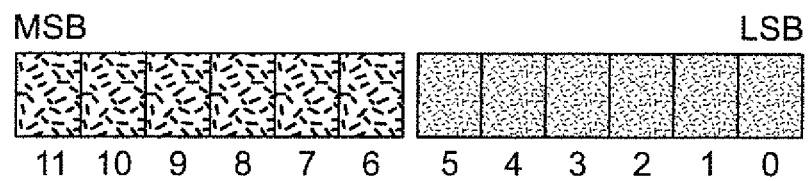
FIG. 2 shows a graphical representation of the composition of the elements of a thermometer-code SAR A/D converter of the prior art.
Figure 3:
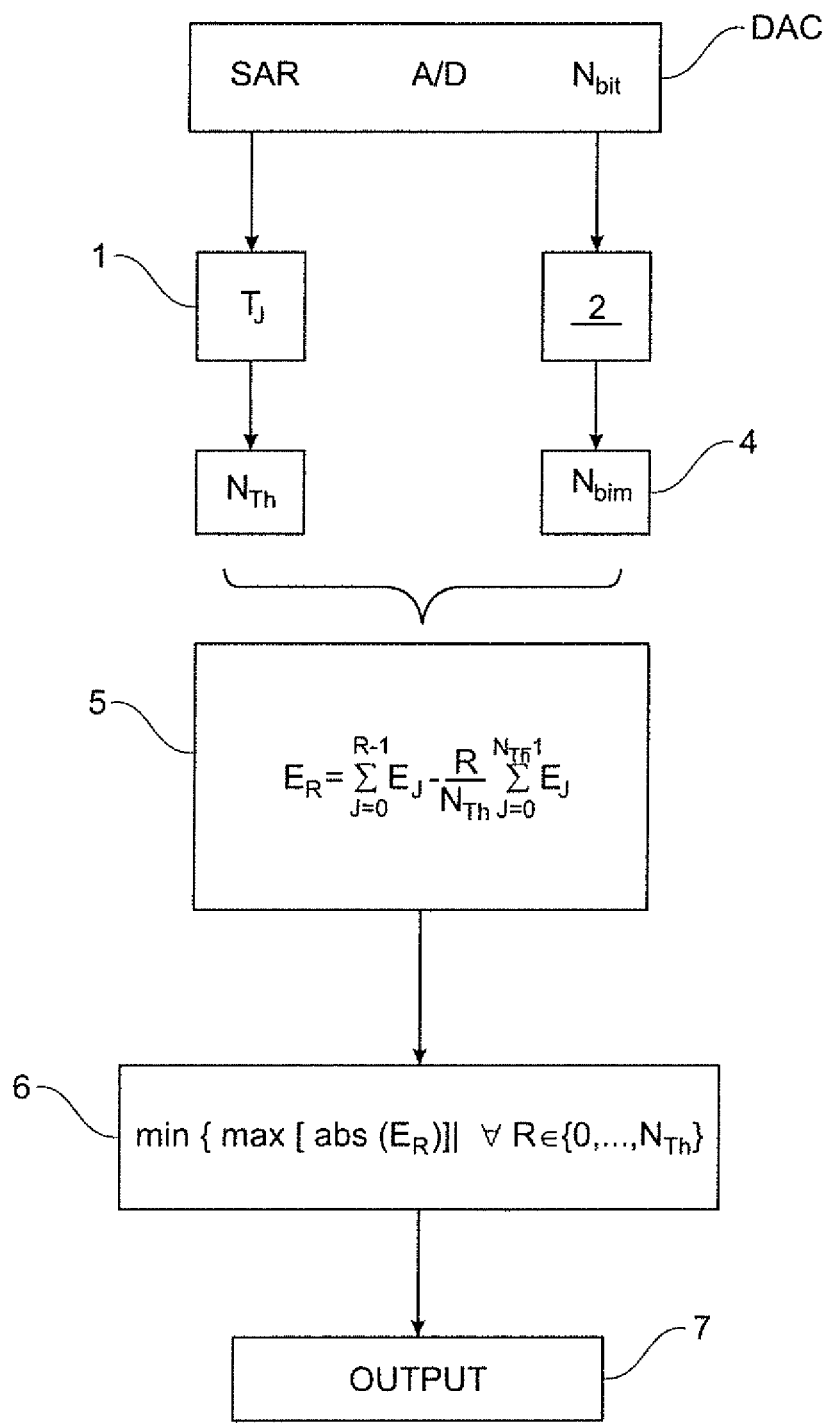
FIG. 3 is a flow chart of the method of calibrating a thermometer-code SAR A/D converter of the present invention.

To minimize or reduce the value of $INL_{Thermo}$ a method for calibration of the thermometer-code SAR-A/D converter is provided. Particularly, also referring to FIG. 3, the thermometer-code SAR-A/D converter comprises an $N_{bit}$ bit digital-to-analog converter (DAC) to generate an $N_{bit}$ bit output code OUTPUT 7. In one aspect, the digital-to-analog converter DAC comprises a plurality of thermometer elements Tj, block 1, and a plurality of binary-weighted elements, block 2.

In the definition of the present calibration method, the binary part of the physical elements is assumed to be perfect, i.e., error-free and designed in an optimized fashion with the available hardware technologies. Such binary part is used for high-precision measurement of the errors $E_j$ of the thermometer elements $T_j$, possibly by way of averaging methods.

Relative differences $E_j$ may be measured using a first subconverter $C_{MSB}$ having a few bits, as the measured difference is between numbers that should have been ideally identical, but are actually similar and not coincident.

For this purpose, a first subset of thermometer elements $T_j$ is designed to be obtained, block 3, from the plurality of physical elements of the converter. The first subset defines the MSB bits of the output code. A second subset of binary weighted elements $N_{bin}$ is also designed to be obtained. The second subset $N_{bin}$ defines the LSB bits of the output code.

Advantageously, in one aspect of an Integral Non-Linearity error value $\epsilon_R$ of an $R^{th}$ thermometer level of the thermometer elements Tj is designed to be determined, block 5, according to the following formula:

$$\varepsilon_R = \sum_{j=0}^{R-1} E_j - \frac{R}{N_{Th}} \sum_{j=0}^{N_{Th}-1} E_j$$

The value $E_j$ represents the relative mismatch differences between the plurality of thermometer elements $T_j$ and a reference thermometer element $T_{ref}$ selected from the plurality of thermometer elements $T_j$ of the digital-to-analog converter (DAC), as measured with the formula:

$$E_j = \frac{T_j - T_{ref}}{T_{tot}}$$

The value $N_{th}$ is the number of thermometer elements. The value R ranges from 0 to $N_{Th}$, with $N_{Th}$ being the number of available levels according to the resolution of the converter, e.g., with $N_{th}$ being 64 if the resolution bits are 6. The value $T_{tot}$ is the total value of the plurality of thermometer elements $T_j$. The total value Ttot may be estimated by the formula:

$$T_{tot} = N_{th} \frac{T_{ref}}{1 - \sum_{j=0}^{j=N_{th}-1} E_j}$$

The mathematical proof of the above formulas may be found in FIG. 4, which shows the most important steps to the definition of the error value $\epsilon_R$.

FIG. 4 shows that the formula of Integral Non-Linear INL error value $\epsilon_R$ of a thermometer-code level $R^{th}$ only depends on Ej, i.e., on the relative differences between the plurality of thermometer elements $T_j$ and a reference thermometer element $T_{ref}$ selected from the plurality of thermometer elements $T_j$ of the digital-to-analog converter (DAC) as measured by the formula:

$$E_j = \frac{T_j - T_{ref}}{T_{tot}}$$

Since the Integral Non-Linearity INL error value $\epsilon_R$ of a thermometer-code level $R^{th}$ is found to depend on $E_j$ then, in one aspect of the calibration method, the maximum or high error value $\epsilon_R$ is miminized or reduced, block 6. In this mode, a minimized or reduced error value may be obtained, which will provide, block 7, the output code OUTPUT according to such a minimized or reduced error.

The above method advantageously provides a process for calibration of the thermometer-code SAR-A/D converter which does not require the use of external hardware or other circuit implementations (i.e., on elements that are part of the converter itself), but only using the plurality of thermometer elements themselves. More particularly, the binary part may be used for high-accuracy measurement of the errors $E_j$ of the thermometer elements $T_j$.

The binary part of the converter has a small dynamic range but is inherently accurate due to the hardware implementation of binary elements. In one aspect, the errors $E_j$ of the thermometer elements $T_j$ may possibly be measured by also using averaging methods.

For this purpose, a step is provided for assessment of the input voltage $V_{INC}$ on the input terminal of the comparator Comp using the following formula:

$$\Delta V = \frac{C_{thX} - C_{thref}}{\sum C} * (VrefP - VrefN)$$

$\Sigma C$ represents the sum of the thermometer elements. VrefP is a first reference voltage on a reference thermometer element $C_{thref}$ of the first subconverter $C_{MSB}$. VrefN is a second reference voltage for all the other thermometer elements of the first subconverter $C_{MSB}$. $C_{thX}$ is the thermometer element being measured and is connected to the first reference voltage VrefP. $C_{thref}$ is the reference thermometer element.

The above formulated difference $\Delta V$ represents the measurement of errors $E_j$. This difference $\Delta V$ is measured using the binary part of the thermometer-code SAR-A/D converter, i.e., using the second subconverter $C_{LSB}$.

The difference $\Delta V$, with which the second subconverter $C_{LSB}$ operates, is a voltage generated inside the thermometer-code SAR A/D converter and is not obtained externally like in the prior art.

The second subconverter $C_{LSB}$, which is a converter having a few bits (particularly $N_{BitBin}$, e.g., six bits in this example) to measure the difference $\Delta V$. This is because the numerator's differences between thermometer elements $C_{thX}$ and $C_{thref}$ are very small, even though they should be zero because the thermometer elements should be identical. In fact, although these differences still exist, they are very small and a converter having a few bits is sufficient to measure them.

The step of assessing the input voltage $V_{INC}$ on the input terminal of the comparator Comp, comprises a step of sampling the first reference voltage VrefP, while maintaining all the other thermometer elements of the first subconverter $C_{MSB}$, connected to the second reference voltage VrefN.

In one aspect, to measure the mismatch $E_j$ of the thermometer elements $T_j$, if these thermometer elements $T_j$ are implemented as capacitors C (see FIG. 8), then there will be a step of sampling the reference voltage VrefP. For instance, this may be based on a reference capacitor $C_{thref}$ of the first subconverter $C_{MSB}$ while maintaining all the other capacitors of the first subconverter $C_{MSB}$ connected to the voltage equal to VrefN.

The voltage VrefP represents the positive reference (typically the supply voltage VDD) and the voltage VrefN represents the negative reference (typically ground GNB).

The above identified error $\epsilon_R$ may be minimized or reduced by determining the appropriate actuation permutation P of the thermometer elements $T_j$ for more accurate calibration.

For this purpose, the above mentioned method step of minimizing or reducing the maximum of the Integral Non-Linearity INL error value $\epsilon_R$ of the Rth thermometer-code level, includes the steps of identifying the maximum or high of the error value $\epsilon_R$ for each level R, recalculating the Integral Non-Linearity error value $\epsilon_R$ for a number of permutations P defined beforehand, and selecting the permutation that minimizes or reduces the error value $\epsilon_R$ from the number P of permutations.

Nevertheless, although this minimization step is effective, there still exists an excessively high number of permutations to be processed by the method, i.e., theoretically corresponding to the factorial of the number of thermometer elements (e.g., 64 in the case of a 6-bit thermometer-code converter).

Therefore, the maximum or highest absolute error $\epsilon_R$ is to be minimized without processing the 64 permutations to actuate the thermometer elements. This may be done, for example, using a metaheuristic algorithm, such as a Simulated Annealing algorithm, a Tabu Search Algorithm or Genetic Algorithms but also, preferably, using a deterministic approach.

In view of using a deterministic approach it should be noted that, for a perfect DAC converter, each thermometer element $T_j$ needs to have a perfect value, i.e., $T_{ideal}$. If this is not the case (i.e., if the converter is not perfect), each time that the thermometer element $T_{Thermo}$ is added, the INL error should change by $\tau_{Thermo}$.

In fact, each thermometer element is affected by an error defined as $DNL_{Thermo}$ which represents, as is also shown from FIG. 4, the Differential Non-Linearity error. This is the difference between the ideal analog-to-digital conversion step and the actual analog-to-digital conversion step.

In the light of the above, assuming a Gaussian arrangement of the thermometer elements $T_j$ centered about their mean value (with the mean value being, by definition, $T_{ideal}$), which means that many thermometer elements $T_j$ should be close to the mean value, to have a small DNL error, and with the start and end points of the INL characteristic error being zero, a thermometer-code sequence very close to the optimal sequence may be constructed.

For this purpose, the element with the greatest DNL error is to be identified and exactly centered on the ideal INL characteristic or, in an equivalent manner, its $DNL_{worst}$ is to be exactly centered at zero.

In a preferred aspect, the method provides an adequately accurate approximation (from 0 or the end-of-scale value) of the DNL error (with opposite sign) of the worst thermometer element, using the elements of the thermometer set having the smallest DNL error. An INL error of ±½ DNLworst should not be exceeded when constructing the INL characteristic.

Once the worst thermometer element is determined and centered with respect to the Integral Non-Linearity INL characteristic, the second worst element is determined by repeating the procedure. The determination does not start from 0 (or the end-of-scale value), but from the position defined by the last determined element (the worst element). This will provide the best possible INL performances for this particular DAC.

The Differential Non-Linearity error value DNL should be calculated for each thermometer element $T_j$, and the thermometer element $T_j'$ with the highest Differential Non-Linearity DNL error value $DNL_{j'}$ should be selected. Once the thermometer element $T_j'$ with the highest error value $DNL_{j'}$ has been determined, such an error value $DNL_{j'}$ is to be centered with respect to the ideal conversion characteristic of the converter. Once such a value $DNL_{j'}$ has been positioned, and in order to reach the value represented by the ideal characteristic, the smallest Differential Non-Linearity DNL error values $DNL_j$ of the remaining thermometer elements $T_j$ are summed.

These steps are iterated as many times as there are thermometer elements left, by repeating the selection of the element with the highest Differential Non-Linearity DNL error value DNL from the remaining thermometer elements T. Its error value DNL is centered with respect to the ideal characteristic. This starts from the position defined by the last determined element.

For example, assuming that there are eight thermometer elements, with the values 0.6, 0.8, 0.9, 1.0, 1.1, 1.2, 1.3, 1.4 respectively, then their average value is 1.0375 and their total value is 8.3. Therefore, no thermometer element is perfect, because the ideal thermometer element would be equal to the average value, i.e., 1.0375.

The sequence of the eight ideal thermometer elements would be 0, 1.0375, 2.075, 3.1125, 4.15, 5.1875, 6.225, 7.2625 e 8.3, or 1.0375*[1 2 3 4 5 6 7 8].

Since this ideal sequence must be approximated using the (actual) available thermometer elements, and with as little deviation as possible from the average value, then the difference between the actual and the ideal values is the BNL of each thermometer element, i.e., 0.4375 (for 0.6), −0.2375 (for 0.8), −0.0375 (for 0.9) and so on.

Therefore, the actual thermometer element may be assumed to be decomposed as follows:

0.6=1.0375−0.4375

0.8=1.0375−0.2375

0.9=1.0375−0.1375

By summing them in their natural order, the following will be obtained:

0.6=1.0375−0.4375

0.6+0.8=2*1.0375−0.4375−0.2375

0.6+0.8+0.9=3*1.0375−0.4375−0.2375−0.1375

. . .

This shows that the deviation from the ideal characteristic is, value after value, equal to the sum of the DNLs. This sum, which represents the INL error, is to be as close as possible to zero.

For the INL error to deviate as little as possible from zero, the previous INL value shall be 0.4375/2, such that the oscillation of the INL about zero is minimized or reduced (from 0.4375/2 to −0.4375/2).

Figure 5:
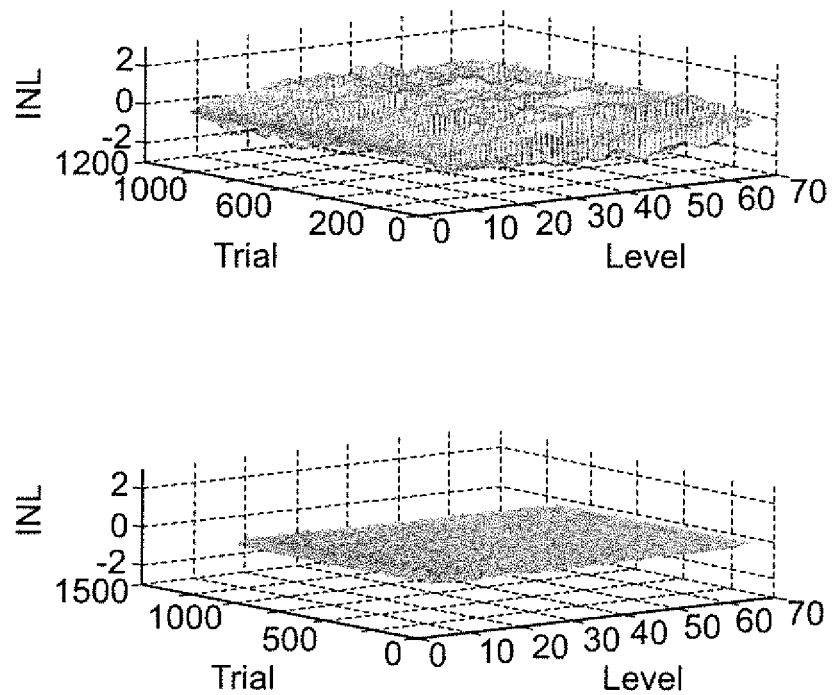
FIGS. 5, 6 and 7 show the result of simulations when a deterministic method is used to solve the method as shown in FIG. 3.
Figure 6:
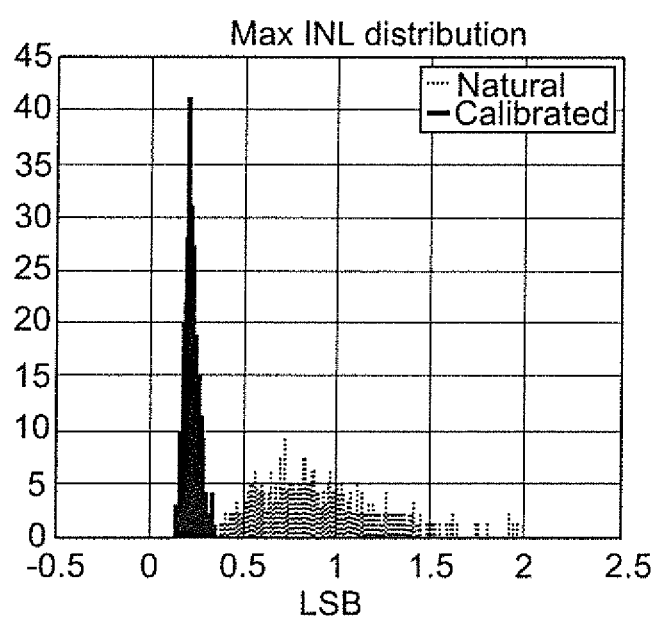
Figure 7:
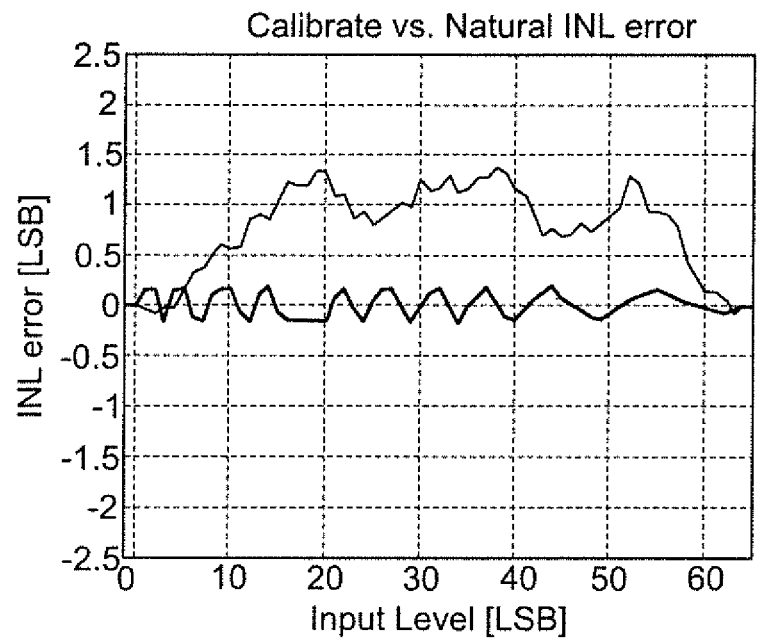

Referring now to FIGS. 5, 6 and 7, the result of simulations is shown using the above described deterministic method.

FIG. 5 shows the effect of calibration on 1024 devices, whereas FIG. 6 shows the distribution of the maximum INL error before (natural) and after (calibrated) the calibration method. FIG. 7 shows the effect of calibration on a single converter device.

Figure 8:
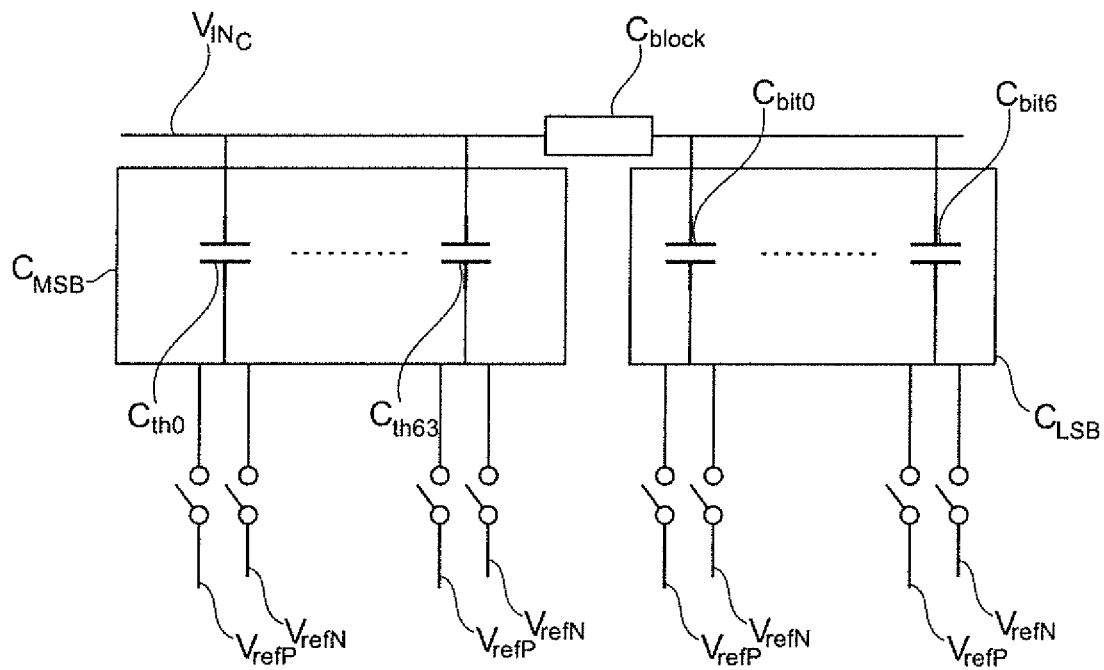
FIG. 8 shows a block diagram of the wiring circuits of thermometer elements and binary-weighted elements as capacitors of the thermometer-code SAR A/D converter of the present invention.

Referring now to FIG. 8, which shows a block diagram of the circuit of thermometer elements and binary-weighted elements as capacitors, the conversion matrix required to carry out the above described calibration method comprises first and second subconverters. The first subconverter $C_{MSB}$ comprises a plurality of thermometer elements. The second subconverter $C_{LSB}$ comprises a plurality of binary-weighted elements.

Advantageously, the number of the thermometer elements of the first subconverter $C_{MSB}$ is $2^{N_{BitTh}}$, and the number of the binary-weighted elements of the second subconverter $C_{LSB}$ is $N_{BitBin}$.

In other words, to implement the above conversion method, the first subconverter $C_{MSB}$ will comprise a number of thermometer elements equal to $2^{N_{bitTh}}$, whereas in the prior art it would have been $(2^{N_{bitTh}})-1$.

Therefore, if there are six thermometer-code bits, the number of thermometer elements that would be used in the prior art would equal to 63 physical elements. In the illustrated embodiment it equals 64 physical elements.

For this purpose the capacitive matrix required for conversion comprises two arrays of capacitors $C_{MSB}$ and $C_{LSB}$. These are the arrays of the most significant and least significant capacitors, MSS array and LSB array respectively, which are connected by an appropriate coupling circuit Cblock.

The coupling circuit Cblock includes, for instance, in a simple wire or a bridge associated with an attenuator capacitor, although a more complex implementation may be also envisaged. The coupling circuit Cblock is required to provide the proper scale relationship between the voltages generated by the two arrays of capacitors $C_{MSB}$ and $C_{LSB}$.

The array $C_{MSB}$ includes as many capacitors as there are thermometer elements, in this case 64. The array $C_{LSB}$ includes as many capacitors as there are binary elements, in this case 6. Each capacitor of the two arrays of capacitors $C_{MSB}$ and $C_{LSB}$ is adapted to be set by a respective switch to a voltage VrefN & VrefP. VrefF is the positive reference (typically VDD) and VrefN is the negative reference (typically ground GND).

To measure the mismatch between two capacitors of the array $C_{MSB}$, the voltage VrefP is sampled based on the capacitor $C_{thref}$ while maintaining all the other capacitors of $C_{MSB}$ connected to VrefN. At the end of the sampling step, the capacitor being measured $C_{thX}$ is connected to VrefP and the reference capacitor $C_{thref}$ is connected to VrefN.

Therefore, the voltage on the input line of the comparator $VIN_C$ is equal to:

$$\Delta V = \frac{C_{thX} - C_{thref}}{\Sigma C} * (VrefP - VrefN)$$

ΣC represents the sum of the thermometer elements.

The completeness of the set of the thermometer elements, which is required to allow the calibration process (the Tj elements are $2^{Nth}$, whereas in a normal implementation they are $2^{Nth}-1$), the binary part of the DAC or $C_{LSB}$ (i.e. the "LSB array") will have to be implemented with the first bit operating in a subtractive mode.

The voltage contribution at the output of the DAC for the first binary bit $C_{bit0}$ will result from the algebraic sum of the contribution of a thermometer element (whose weight is Tj) and the first binary element (whose weight is $-\frac{1}{2}*Tj$). Thus, the binary subconverter $C_{LS}$ or LSB array will generate half of the positive levels and half of the negative levels. During the calibration process, both positive and negative deviations in the thermometer-code capacitor are being tested. This is for the cases in which $C_{thref}$ is greater than $C_{thX}$ or in which $C_{thref}$ is smaller than $C_{thX}$.

Those skilled in the art will obviously appreciate that a number of changes and variations as described above may be made to fulfill particular requirements, without departure from the scope of the invention, as defined in the following claims.

The invention claimed is:

1. A method of calibrating a thermometer-code successive approximation register analog-to-digital (SAR-A/D) converter comprising an $N_{bit}$-bit digital-to-analog converter (DAC) for outputting an $N_{bit}$-bit output code, the DAC comprising a first subconverter having a plurality of $N_{Th}$ thermometer elements $T_j$ and a second subconverter having a plurality of $N_{Bin}$ binary-weighted elements, the plurality of thermometer elements $T_j$ defining the MSB bits of the $N_{bit}$-bit code and the plurality of binary-weighted elements $N_{bin}$ defining the LSB bits of the $N_{bit}$-bit output code, with the $N_{bit}$-bit output code being equal to the sum of $N_{BitTh}$ and $N_{BitBin}$ where $N_{Th}=2^{N_{BitTh}}$ and $N_{BitBin}$ is equal to $N_{Bin}=N_{BitBin}$, the method of calibrating comprising:

determining an Integral Non-Linearity error value ($\epsilon_R$) of an $R^{th}$ thermometer-code level of the thermometer elements $T_j$ according to the formula:

$$\epsilon_R = \sum_{j=0}^{R-1} E_j - \frac{R}{N_{Th}} \sum_{j=0}^{N_{Th}-1} E_j$$

where:
$E_j$ represents relative mismatch differences between the plurality of thermometer elements $T_j$ and a reference thermometer element $T_{ref}$ selected from the plurality of thermometer elements $T_j$ of the first subconverter;
minimizing a maximum of the error value $\epsilon_R$ to obtain a minimized error value; and
generating the output code according to the minimized error.

2. The method of calibrating a thermometer-code SAR-A/D converter according to claim 1, wherein the relative mismatch differences $E_j$ of the first subconverter are measured according to the following formula:

$$E_j = \frac{T_j - T_{ref}}{T_{tot}}, T_{tot} = \sum_{k=0}^{N_{Th}-1} T_k, T_{ref} \in \{T_0 \ldots T_{N_{Th}-1}\}$$

where:
$N_{bit}$ defines resolution of the DAC which is $2^{N_{bit}}$;
R ranges from 0 to $N_{Th}$ and represents a number of available thermometer-code levels; and
$T_{tot}$ is a total value of the plurality of thermometer elements $T_j$, with the total value $T_{tot}$ being calculated according to the following formula:

$$T_{tot} = \sum_{k=0}^{N_{Th}-1} T_k = N_{Th} \frac{T_{ref}}{1 - \sum_{j=0}^{N_{Th}-1} E_j}.$$

3. The method of calibrating a thermometer-code SAR-A/D converter according to claim 2, wherein the thermometer-code SAR-A/D converter comprises a comparator having an input terminal, and the step of measuring the relative mismatch differences $E_j$ comprises a step of assessing an input voltage on the input terminal of the comparator according to the following formula:

$$\Delta V = \frac{C_{thX} - C_{thref}}{\Sigma C} * (VrefP - VrefN)$$

where:
ΣC represents a sum of the thermometer elements;
VrefP is a first reference voltage on a reference thermometer element of the first subconverter;
VrefN is a second reference voltage for all the other thermometer elements of the first subconverter;
$C_{thX}$ is the thermometer element being measured and is connected to the first reference voltage;
$C_{thref}$ is the reference thermometer element; and
ΔV is a measurement of the errors $E_j$.

4. The method of calibrating a thermometer-code SAR-A/D converter according to claim 3, wherein the step of assessing the input voltage on the input terminal of the comparator comprises sampling the first reference voltage, while maintaining all the other thermometer elements of the first subconverter, connected to the second reference voltage.

5. The method of calibrating a thermometer-code SAR-A/D converter according to claim 4, wherein at an end of the sampling step, the thermometer element being measured among the plurality of thermometer elements is connected to the first reference voltage, and the reference thermometer element is connected to the second reference voltage.

6. The method of calibrating a thermometer-code SAR-A/D converter according to claim 3, wherein the ΔV is measured based on the second subconverter.

7. The method of calibrating a thermometer-code SAR-A/D converter according to claim 1, wherein the step of minimizing the maximum of the Integral Non-Linearity error value $\epsilon_R$ of the R-$^{th}$ thermometer-code level comprises:
identifying a maximum of the error value $\epsilon_R$ for each level R;
recalculating the Integral Non-Linearity error value $\epsilon_R$ for a number of permutations P defined beforehand; and
selecting a permutation that minimizes the error value $\epsilon_R$ from the number P of permutations.

8. The method of calibrating a thermometer-code SAR-A/D converter according to claim 1, wherein the step of determining the Integral Non-Linearity INL error value $\epsilon_R$ for each R thermometer-code level of the thermometer elements $T_j$ comprises:
- calculating, for each of the plurality of thermometer elements $T_j$, a Differential Non-Linearity DNL error value $\epsilon_{DNL}$;
- selecting the thermometer element $T_j'$ having a highest Differential Non-Linearity DNL error value $\epsilon_{DNL}$ from the plurality of thermometer elements $T_j$;
- providing an ideal conversion characteristic of the converter;
- centering the error value $\epsilon_{DNL}$ of the thermometer element $T_j'$ with respect to the ideal conversion characteristic of the converter; and
- summing a lowest Differential Non-Linearity error values $\epsilon_{DNL}$ of the plurality of thermometer elements until a value of the ideal characteristic is reached.

9. The method of calibrating a thermometer-code SAR-A/D converter according to claim 8, further comprising:
- repeating the selection of the thermometer element having the highest Differential Non-Linearity DNL error value $\epsilon_{DNL}$ from the remaining thermometer elements of the plurality of thermometer elements $T_j$; and
- centering the Differential Non-Linearity error value $\epsilon_{DNL}$ with respect to the ideal characteristic from a position defined by the last determined element.

10. The method of calibrating a thermometer-code SAR-A/D converter according to claim 9, wherein the steps of repeating and centering are repeated as many times as there are thermometer elements $T_j$.

11. A method of calibrating a thermometer-code successive approximation register analog-to-digital (SAR-A/D) converter comprising an $N_{bit}$-bit digital-to-analog converter (DAC) for outputting an $N_{bit}$-bit output code, the DAC comprising a first subconverter having a plurality of $N_{Th}$ thermometer elements $T_j$ and a second subconverter having a plurality of $N_{Bin}$ binary-weighted elements, the plurality of thermometer elements $T_j$ defining the MSB bits of the $N_{bit}$-bit code and the plurality of binary-weighted elements $N_{Bin}$ defining the LSB bits of the $N_{bit}$-bit output code, with the $N_{bit}$-bit output code being equal to the sum of $N_{BitTh}$ and $N_{BitBin}$ where $N_{Th}=2^{N_{BitTh}}$ and $N_{BitBin}$ is equal to $N_{Bin}=N_{BitBin}$, the method of calibrating comprising:
- determining an Integral Non-Linearity error value ($\epsilon_R$) of an $R^{th}$ thermometer-code level of the thermometer elements $T_j$ according to the formula:

$$\varepsilon_R = \sum_{j=0}^{R-1} E_j - \frac{R}{N_{Th}} \sum_{j=0}^{N_{Th}-1} E_j$$

where:
$E_j$ represents relative mismatch differences between the plurality of thermometer elements $T_j$ and a reference thermometer element $T_{ref}$ selected from the plurality of thermometer elements $T_j$ of the first subconverter;
reducing a high error value $\epsilon_R$ to obtain a reduced error value; and
generating the output code according to the reduced error.

12. The method of calibrating a thermometer-code SAR-A/D converter according to claim 11, wherein the relative mismatch differences $E_j$ of the first subconverter are measured according to the following formula:

$$E_j = \frac{T_j - T_{ref}}{T_{tot}}, T_{tot} = \sum_{k=0}^{N_{Th}-1} T_k, T_{ref} \in \{T_0 \ldots T_{N_{Th}-1}\}$$

where:
$N_{bit}$ defines resolution of the DAC which is $2^{N_{bit}}$;
R ranges from 0 to $N_{Th}$ and represents a number of available thermometer-code levels; and
$T_{tot}$ is a total value of the plurality of thermometer elements $T_j$, with the total value $T_{tot}$ being calculated according to the following formula:

$$T_{tot} = \sum_{k=0}^{N_{Th}-1} T_k = N_{Th} \frac{T_{ref}}{1 - \sum_{j=0}^{j=N_{Th}-1} E_j}.$$

13. The method of calibrating a thermometer-code SAR-A/D converter according to claim 12, wherein the thermometer-code SAR-A/D converter comprises a comparator having an input terminal, and the step of measuring the relative mismatch differences $E_j$ comprises a step of assessing an input voltage on the input terminal of the comparator according to the following formula:

$$\Delta V = \frac{C_{thX} - C_{thref}}{\sum C} * (VrefP - VrefN)$$

where:
$\Sigma C$ represents a sum of the thermometer elements;
VrefP is a first reference voltage on a reference thermometer element of the first subconverter;
VrefN is a second reference voltage for all the other thermometer elements of the first subconverter;
$C_{thX}$ is the thermometer element being measured and is connected to the first reference voltage;
$C_{thref}$ is the reference thermometer element; and
$\Delta V$ is a measurement of the errors.

14. The method of calibrating a thermometer-code SAR-A/D converter according to claim 13, wherein the step of assessing the input voltage on the input terminal of the comparator comprises sampling the first reference voltage, while maintaining all the other thermometer elements of the first subconverter, connected to the second reference voltage.

15. The method of calibrating a thermometer-code SAR-A/D converter according to claim 14, wherein at an end of the sampling step, the thermometer element being measured of the plurality of thermometer elements is connected to the first reference voltage, and the reference thermometer element is connected to the second reference voltage.

16. The method of calibrating a thermometer-code SAR-A/D converter according to claim 13, wherein the $\Delta V$ is measured based on the second subconverter.

17. The method of calibrating a thermometer-code SAR-A/D converter according to claim 11, wherein the step of reducing the high value of the Integral Non-Linearity error value $\epsilon_R$ of the R-$^{th}$ thermometer-code level comprises:
- identifying a high error value $\epsilon_R$ for each level R;
- recalculating the Integral Non-Linearity error value $\epsilon_R$ for a number of permutations P defined beforehand; and
- selecting a permutation that reduces the error value $\epsilon_R$ from the number P of permutations.

18. The method of calibrating a thermometer-code SAR-A/D converter according to claim 11, wherein the step of determining the Integral Non-Linearity INL error value $\epsilon_R$ for each R thermometer-code level of the thermometer elements $T_j$ comprises:
- calculating, for each of the plurality of thermometer elements $T_j$, a Differential Non-Linearity DNL error value $\epsilon_{DNL}$;
- selecting the thermometer element $T_j'$ having a highest Differential Non-Linearity DNL error value $\epsilon_{DNL}$ from the plurality of thermometer elements $T_j$;
- providing an ideal conversion characteristic of the converter;
- centering the error value $\epsilon_{DNL}$ of the thermometer element $T_j'$ with respect to the ideal conversion characteristic of the converter; and
- summing a lowest Differential Non-Linearity error values $\epsilon_{DNL}$ of the plurality of thermometer elements until a value of the ideal characteristic is reached.

19. The method of calibrating a thermometer-code SAR-A/D converter according to claim 18, further comprising:
- repeating the selection of the thermometer element having the highest Differential Non-Linearity DNL error value $\epsilon_{DNL}$ from the remaining thermometer elements of the plurality of thermometer elements $T_j$; and
- centering the Differential Non-Linearity error value $\epsilon_{DNL}$ with respect to the ideal characteristic from a position defined by the last determined element.

20. The method of calibrating a thermometer-code SAR-A/D converter according to claim 19, wherein the steps of repeating and centering are repeated as many times as there are thermometer elements $T_j$.

* * * * *